United States Patent
Origlia

(10) Patent No.: US 7,344,578 B2
(45) Date of Patent: Mar. 18, 2008

(54) BREATHER VALVE DEVICE FOR THE CONTAINER FOR AN ELECTRONIC CONTROL UNIT

(75) Inventor: Aulo Origlia, Asti (IT)

(73) Assignee: Gate S.R.L., Turin (IT)

( * ) Notice: Subject to any disclaimer, the term of this patent is extended or adjusted under 35 U.S.C. 154(b) by 320 days.

(21) Appl. No.: 10/979,146

(22) Filed: Nov. 3, 2004

(65) Prior Publication Data

US 2005/0091949 A1    May 5, 2005

(30) Foreign Application Priority Data

Nov. 4, 2003   (IT) .......................... TO20030169 U

(51) Int. Cl.
*B01D 19/00* (2006.01)
(52) U.S. Cl. ...................... 55/385.4; 55/385.1; 55/524; 55/527; 96/13; 96/14; 96/134
(58) Field of Classification Search ............... 55/385.1, 55/385.4, 524, 527; 96/13, 14, 134
See application file for complete search history.

(56) References Cited

U.S. PATENT DOCUMENTS

| 5,914,415 | A | * | 6/1999 | Tago | ........................ | 55/385.4 |
| 7,083,660 | B2 | * | 8/2006 | Hara et al. | .................. | 55/385.4 |
| 2002/0066370 | A1 | * | 6/2002 | Goglio et al. | .................. | 96/134 |
| 2005/0091950 | A1 | * | 5/2005 | Weaver et al. | ............. | 55/385.4 |

* cited by examiner

*Primary Examiner*—Duane Smith
*Assistant Examiner*—Minh-Chau T. Pham
(74) *Attorney, Agent, or Firm*—Sughrue Mion, PLLC

(57) ABSTRACT

A breather valve device for a container for an electronic control unit, includes a support structure including, a substantially planar wall having first and second surfaces intended to face outwardly and inwardly of the container respectively, and in which is formed an aperture, and a projecting, essentially cylindrical, tubular wall extending from the first surface of the planar wall, substantially around the aperture; an interceptor element having a smaller cross section than the passage cross section of the tubular wall and of the aperture; the interceptor element being disposed inside an axially intermediate portion of the tubular wall, spaced radially from the latter so as to define, with respect to the tubular wall, a narrow annular gap; the interceptor element being connected to the support structure by at least one connector formation. The support structure, the interceptor element and the connector formation are integrally formed in one piece of molded plastics material. The valve device further includes a membrane permeable to gases and substantially impermeable to liquids, fixed to the second surface of the planar wall of the support structure so as to cover the aperture completely.

8 Claims, 3 Drawing Sheets

BREATHER VALVE DEVICE FOR THE CONTAINER FOR AN ELECTRONIC CONTROL UNIT

BACKGROUND OF THE INVENTION

The present invention relates to a breather valve device for the container of an electronic control unit such as, for example, a unit for controlling the operation of an electric cooling fan for an internal combustion engine in a motor vehicle.

SUMMARY OF THE INVENTION

One object of the present invention is to provide an improved breather valve device, which allows air to flow from inside the control unit towards the outside environment and vice-versa, while preventing liquids, and in particular water, from entering the container.

An additional object of the invention is to provide such a breather valve device which can be manufactured by simple and inexpensive methods, in particular by the injection moulding of plastics materials, using relatively simple dies and counter-dies, without the need for so-called movable elements.

These and other objects are achieved according to the invention by providing a breather valve device comprising a support structure including,
- a substantially planar wall having first and second surfaces intended to face inwardly and outwardly of the container respectively, and in which an aperture is formed, and
- an essentially cylindrical tubular wall projecting from the first surface of the said planar wall, substantially around the said aperture;

an interceptor element which is smaller in cross section than the passage cross section of the said tubular wall and of the said aperture; the interceptor element being disposed inside an axially intermediate portion within the tubular wall, spaced radially from this latter so as to form a narrow annular air gap between it and the tubular wall; the interceptor element being connected to the support structure by means of at least one connector formation;

the support structure, the interceptor element and the said at least one connector formation all being molded in one piece from a plastics material;

the breather valve device further including
- a membrane which is permeable to gases and substantially impermeable to liquids, fixed to the said second surface of the planar wall of the support structure, so as to cover the said aperture completely.

BRIEF DESCRIPTION OF THE DRAWINGS

Further characteristics and advantages on the invention will become apparent from the detailed description which follows, provided purely by way of non-limitative example, with reference to the appended drawings, in which:

In FIG. 1, an electronic control unit, for example a control unit for a cooling fan for the internal combustion engine of a motor vehicle, is generally indicated.

Figure 1:
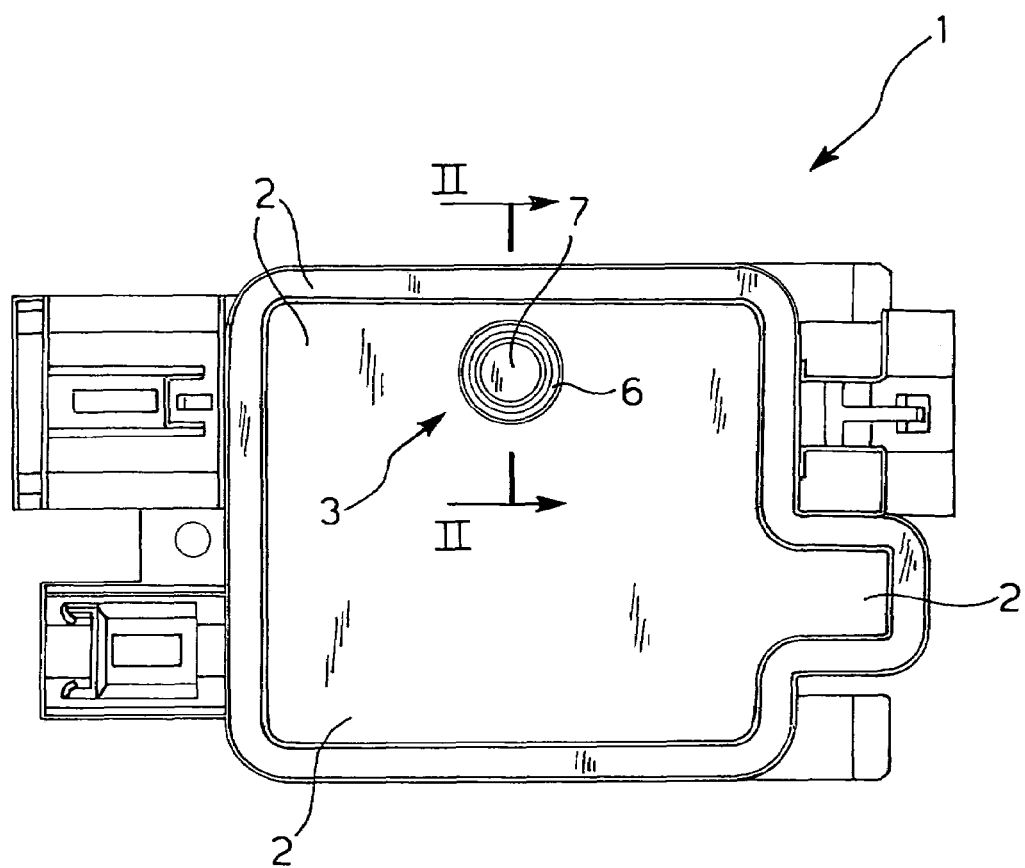
FIG. 1 is a plan view from above of an electronic control unit, the casing or container of which has a breather valve device according to the present invention.
Figure 2:
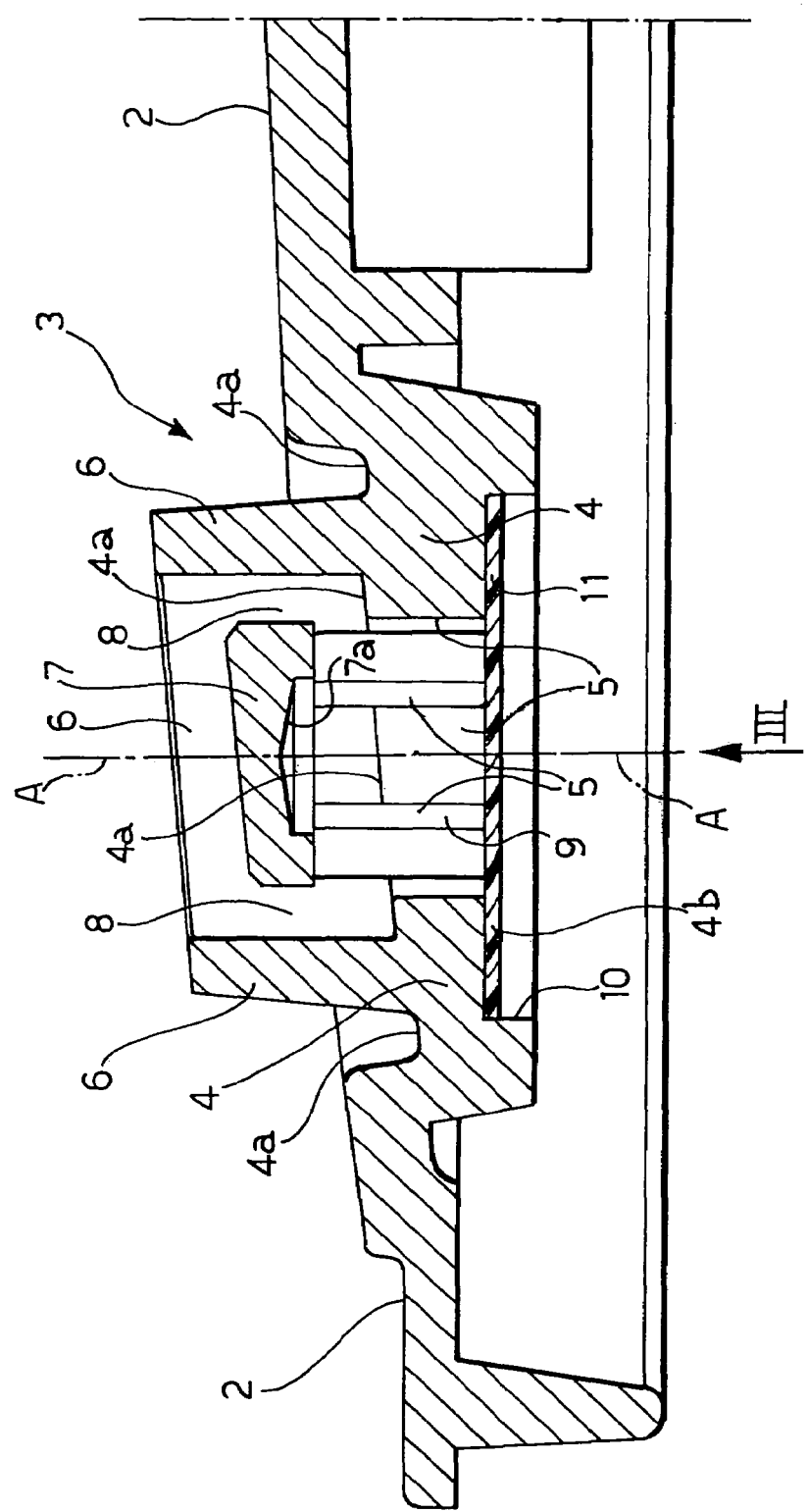
FIG. 2 is a partial view, on an enlarged scale, of a section taken on the line II-II of FIG. 1.
Figure 3:
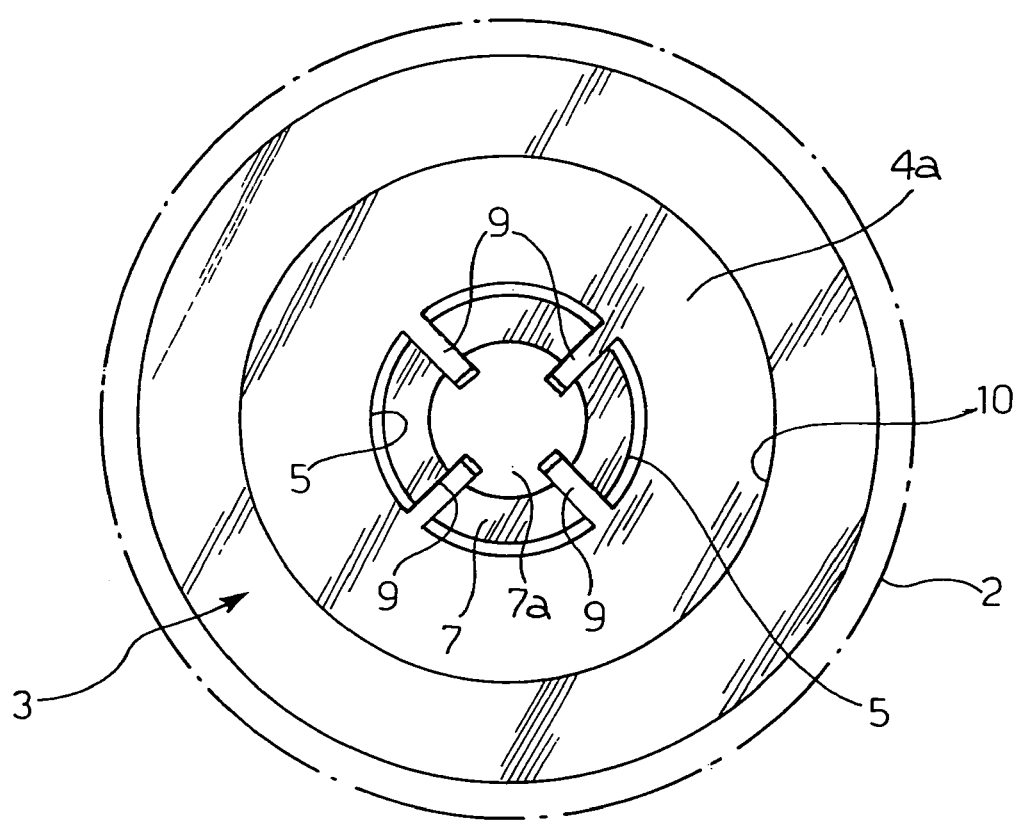
FIG. 3 is a partial plan view, from below, essentially in the direction of the arrow III of FIG. 2, and shows a breather valve device according to the invention without the membrane forming part thereof.

The control unit 1 has a casing including, in a manner known per se, an essentially basin-like container (not shown in FIG. 1) coupled to a lid indicated 2 in FIGS. 1 to 3.

In a manner known per se, the lid 2 is sealingly coupled to the rim or mouth of the associated basin-like container housing the components and devices of the electronic control unit.

As can be seen better in FIGS. 1 and 2, the lid 2 has an associated breather valve device, generally indicated 3.

In the embodiment illustrated, the valve device 3 comprises a support structure including a substantially planar wall 4, having first and second surfaces 4a, 4b facing outwardly of the container of the unit 1 and inwardly thereof respectively.

An aperture, preferably circular and indicated 5 is formed in the essentially planar wall 4.

The aforesaid support structure also includes an essentially cylindrical tubular projecting wall 6 extending from the upper surface 4a of the planar wall 4, substantially around the aperture 5.

An interceptor element, indicated 7 in the illustrated exemplary embodiment, is substantially disc shape, with a cavity or recess 7a in its lower surface.

The interceptor element 7 is smaller in cross section than the passage cross section through the tubular wall 6 and the aperture 5 through the planar wall 4. This interceptor element 7 is disposed in an axially intermediate position between the ends of the tubular wall 6, and is spaced radially from this wall so as to define a narrow gap, indicated 8 in FIG. 2.

In the embodiment illustrated by way of example, the interceptor element 7 is connected to the wall 4 of the support structure by means of four connector formations, indicated 9 in FIGS. 2 and 3, each extending parallel to the axis A-A of the aperture 5.

The support structure 4, 6, the interceptor element 7 and the connector formations 9 are conveniently all molded in one piece from a plastics material, for example by injection moulding. In order to mould the device using only a die and a counter-die, without the need for movable elements, it is convenient if the cross section of the passage through the aperture 5 is slightly larger than the cross section of the interceptor element 7. In the embodiment illustrated the transverse dimensions, for example, of the aperture 5 are smaller than those of the passage section through the tubular wall 6.

A concave seat, indicated 10 in FIGS. 2 and 3, is formed in the lower surface 4b of the wall 4.

A membrane (shown only in FIG. 2), which is permeable to gases and substantially impermeable to liquids is indicated 11. This membrane is made of a microporous hydrophobic material, for example, such as polyethylene terephthalate (Teflon).

The membrane 11 is fixed to the lower surface 4b of the wall 4 of the support structure, so as to cover the aperture 5 completely. Preferably, the membrane 11 also extends over the portion of the surface 4b of the wall 4 around the aperture 5, and is fixed thereto by welding or adhesive.

It is convenient if, as shown in the drawings, the support structure 4, 6, the interceptor element 7 and the connector formations 9 are formed integrally, that is made in one piece, with a wall of the casing of the electronic control unit 1, and preferably integrally with the lid 2.

In use, the membrane 11 allows air, and airborne agents in general, to pass from inside the container of the control unit 1 to the outside and vice-versa. However this membrane prevents any liquids from entering the casing of the control unit 1.

The structure including the tubular wall 6 and the interceptor element 7 ensures that the membrane 11 is protected from splashes of liquid, in particular water, which may come into contact with it during use. In particular, the interceptor element 7 tends to protect the upper surface of the membrane 11 from splashes of liquid coming towards the membrane from a substantially perpendicular direction, while the tubular wall 6 acts as an effective barrier to splashes of water or any other liquid coming at an inclined direction.

Conveniently, the annular space 8 and the axial distance between the interceptor element 7 and the upper surface 4*a* of the wall 4 are as small as possible, in order correspondingly to reduce the chance of liquids being able to reach and be deposited on the upper surface of the membrane 11.

The breather valve device of the invention can be made both simply and inexpensively and offers a high degree of reliability in use.

Naturally, the principle of the invention remaining unchanged, embodiments and manufacturing details may vary widely from those described and illustrated here purely by way of non-limitative example, without departing thereby from the scope of the invention as claimed in the appended claims.

What is claimed is:

1. A breather valve device for the casing of an electronic control unit, comprising:
    a support structure comprising:
        a substantially planar wall having first and second surfaces respectively, facing outwardly and inwardly of the casing, respectively, and having an aperture formed therein, and
        a substantially cylindrical tubular wall projecting outwardly of the casing from the first surface of the planar wall, substantially around the aperture; and
    an interceptor element smaller in cross section than the passage cross-section of the tubular wall and the section of the aperture; the interceptor element being disposed in an axially intermediate position inside the tubular wall, and spaced radially therefrom so as to define, with respect to said tubular wall, a narrow annular gap, the interceptor element being connected to the support structure by at least one connector formation,
    wherein the support structure, the interceptor element and the at least one connector formation are formed integrally in one piece of molded plastic, and
    wherein the valve device further includes
        a membrane which is permeable to gases but substantially impermeable to liquids, fixed to the second surface of the planar wall of the support structure in such a way as to cover the said aperture completely.

2. A breather valve device according to claim 1, wherein the interceptor element is substantially in the form of a disc.

3. A breather valve device according to claim 1, wherein the passage cross section through the said aperture in the substantially planar wall is smaller than that through the aforesaid tubular wall.

4. A breather valve device according to claim 1, wherein a recessed seat is formed in the second surface of the planar wall and the membrane is secured to the bottom wall of this recessed seat.

5. A breather valve device according to claim 1, wherein the interceptor element is connected to the substantially planar wall of the support structure.

6. A breather valve device according to claim 5, wherein the element is connected to the rim of the aperture in the planar wall by means of a plurality of connector formations extending substantially parallel to the axis of the said aperture.

7. A breather valve device according to claim 1, wherein the membrane is made of a microporous hydrophobic material including polyethylene terephthalate (Teflon).

8. A breather valve device according to claim 1, wherein the support structure, the interceptor element and the said at least one connector formation are formed integrally in one piece with a lid of the casing of an electronic control unit.

* * * * *